(12) United States Patent
Bryzek et al.

(10) Patent No.: US 6,346,742 B1
(45) Date of Patent: Feb. 12, 2002

(54) CHIP-SCALE PACKAGED PRESSURE SENSOR

(75) Inventors: Janusz Bryzek, Fremont; David W. Burns, San Jose; Sean S. Cahill, Palo Alto; Steven S. Nasiri, Saratoga, all of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/190,500

(22) Filed: Nov. 12, 1998

(51) Int. Cl.⁷ ............................................... H01L 23/12
(52) U.S. Cl. .................... 257/704; 257/419; 257/619
(58) Field of Search .................................... 257/704, 701, 257/619, 415, 419

(56) References Cited

U.S. PATENT DOCUMENTS

| | | |
|---|---|---|
| 3,247,719 A | 4/1966 | Chelner |
| 3,328,649 A | 6/1967 | Rindner et al. |
| 3,739,315 A | 6/1973 | Kurtz et al. |
| 3,994,009 A | 11/1976 | Hartlaub |
| 4,019,388 A | 4/1977 | Hall, II et al. |
| 4,023,562 A | 5/1977 | Hynecek et al. |
| 4,033,787 A | 7/1977 | Marshall |
| 4,040,297 A | 8/1977 | Karsmakers et al. |
| 4,050,049 A | 9/1977 | Youmans |
| 4,125,820 A | 11/1978 | Marshall |
| 4,129,042 A | 12/1978 | Rosvold |
| 4,229,979 A | 10/1980 | Greenwood |
| 4,236,137 A | 11/1980 | Kurtz et al. |
| 4,241,325 A | 12/1980 | Di Giovanni |
| 4,276,533 A | 6/1981 | Tominaga et al. |
| 4,295,115 A | 10/1981 | Takahashi et al. |
| 4,317,126 A | 2/1982 | Gragg, Jr. |
| 4,399,707 A | 8/1983 | Wamstad |
| 4,467,656 A | 8/1984 | Mallon et al. |
| 4,502,335 A | 3/1985 | Wamstad et al. |
| 4,609,966 A | 9/1986 | Kuisma |
| 4,655,088 A | 4/1987 | Adams |
| 4,656,454 A | 4/1987 | Rosenberger |
| 4,665,754 A | 5/1987 | Glenn et al. |
| 4,686,764 A | 8/1987 | Adams et al. |
| 4,737,756 A | 4/1988 | Bowman |
| 4,763,098 A | 8/1988 | Glenn et al. |
| 4,771,639 A | 9/1988 | Saigusa et al. |
| 4,773,269 A | 9/1988 | Knecht et al. |
| 4,790,192 A | 12/1988 | Knecht et al. |
| 4,800,758 A | 1/1989 | Knecht et al. |
| 4,842,685 A | 6/1989 | Adams |
| 4,879,903 A | 11/1989 | Ramsey et al. |

(List continued on next page.)

FOREIGN PATENT DOCUMENTS

| | | |
|---|---|---|
| DE | 4227893 | 4/1993 |
| EP | 0 500 234 A2 | 8/1992 |
| JP | 58039069 | 3/1983 |
| JP | 60233863 | 11/1985 |
| JP | 08153816 | 6/1996 |
| WO | 96/26424 | 8/1996 |

Primary Examiner—Roy Potter
(74) Attorney, Agent, or Firm—Blakely, Sokoloff, Taylor & Zafman LLP

(57) ABSTRACT

A chip-scale sensor package is described. In one embodiment, the chip-scale sensor package includes a semiconductor substrate having a sensor region, and a semiconductor cap having a recess. The semiconductor cap is bonded to the semiconductor substrate with a thermocompression bond to form a cavity therebetween. The semiconductor substrate is bonded to the semiconductor cap using different types of materials. The semiconductor substrate and/or the semiconductor cap may optionally include a semiconductor device such as an electronically trimmable integrated circuit fabricated thereon. In addition, the semiconductor substrate may optionally include an integral stress isolation flexible region for isolation of the sensor region.

82 Claims, 7 Drawing Sheets

U.S. PATENT DOCUMENTS

| | | |
|---|---|---|
| 4,905,575 A | 3/1990 | Knecht et al. |
| 4,918,992 A | 4/1990 | Mathias |
| 4,942,383 A | 7/1990 | Lam et al. |
| 4,972,716 A | 11/1990 | Tobita et al. |
| 4,996,627 A | 2/1991 | Zias et al. |
| 5,064,165 A | 11/1991 | Jerman |
| 5,142,912 A | 9/1992 | Frische |
| 5,156,052 A | 10/1992 | Johnson et al. |
| 5,157,972 A | 10/1992 | Broden et al. |
| 5,172,205 A | 12/1992 | French et al. |
| 5,174,156 A | 12/1992 | Johnson et al. |
| 5,177,579 A | 1/1993 | Jerman |
| 5,178,015 A | 1/1993 | Loeppert et al. |
| 5,184,107 A | 2/1993 | Maurer |
| 5,186,055 A | 2/1993 | Kovacich et al. |
| 5,188,983 A | 2/1993 | Guckel et al. |
| 5,209,118 A | 5/1993 | Jerman |
| 5,220,835 A | 6/1993 | Stephan |
| 5,257,546 A | 11/1993 | Tobita et al. |
| 5,295,395 A | 3/1994 | Hocker et al. |
| 5,333,504 A | 8/1994 | Lutz et al. |
| 5,412,994 A | 5/1995 | Cook et al. |
| 5,438,877 A | 8/1995 | Vowles et al. |
| 5,454,270 A | 10/1995 | Brown et al. |
| 5,459,351 A | 10/1995 | Bender |
| 5,465,626 A | 11/1995 | Brown et al. |
| 5,477,738 A | 12/1995 | Tobita et al. |
| 5,483,834 A | 1/1996 | Frick |
| 5,509,312 A | 4/1996 | Donzier et al. |
| 5,515,732 A | 5/1996 | Willcox et al. |
| 5,539,236 A | 7/1996 | Kurtz et al. |
| 5,600,071 A * | 2/1997 | Sooriakumar et al. ........ 73/721 |
| 5,646,072 A * | 7/1997 | Maudie et al. .............. 437/228 |
| 5,684,253 A | 11/1997 | Bonne et al. |

* cited by examiner

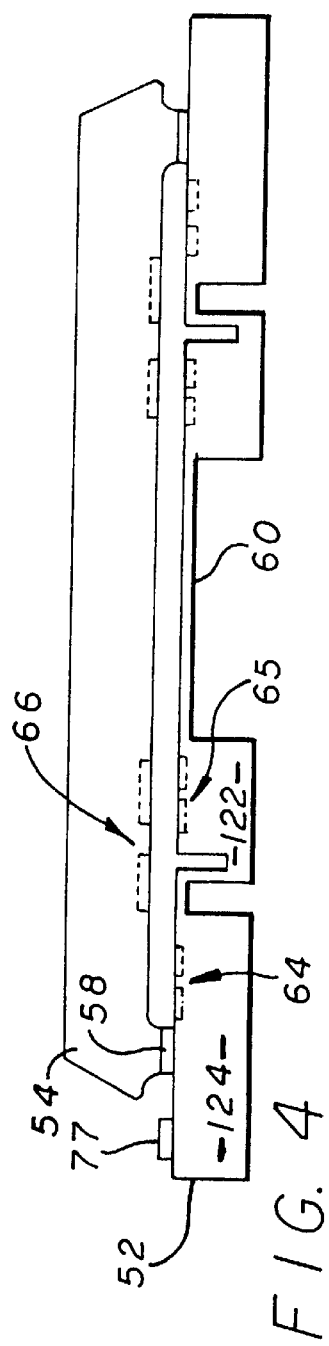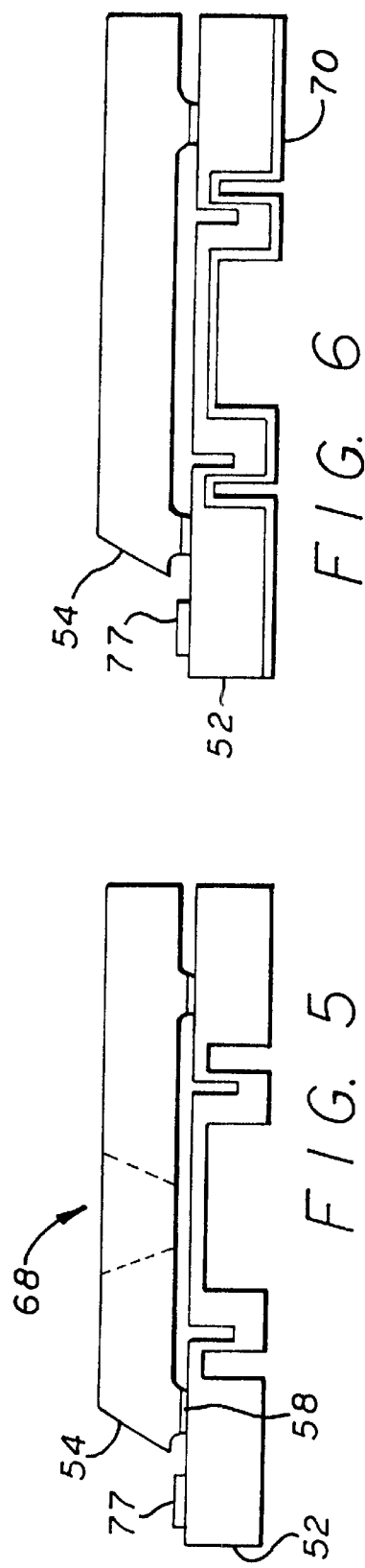

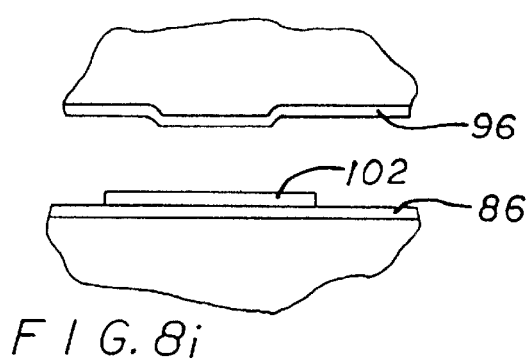
FIG. 8i
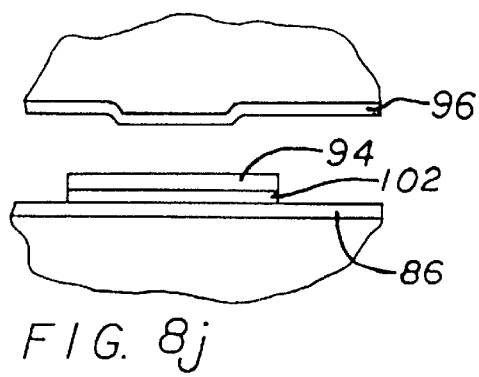
FIG. 8j
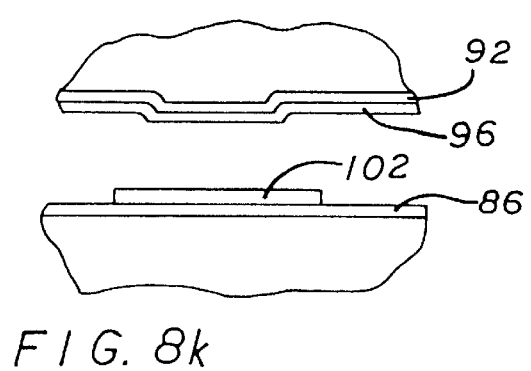
FIG. 8k
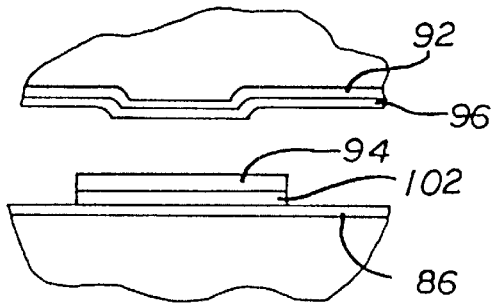
FIG. 8l
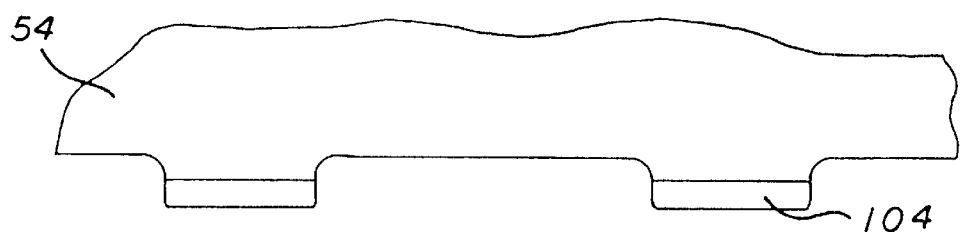
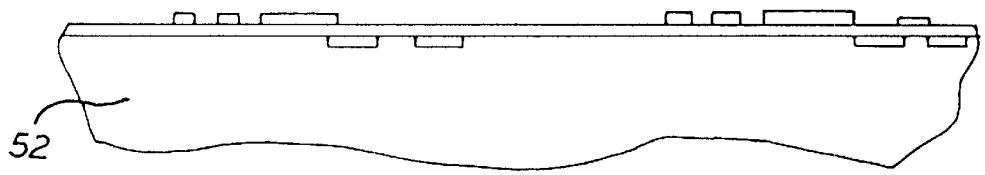
FIG. 9

CHIP-SCALE PACKAGED PRESSURE SENSOR

BACKGROUND OF THE INVENTION

1. Field of the Invention

The present invention relates generally to semiconductor pressure sensors, and specifically, to a chip-scale packaged pressure sensor.

2. Background Information

FIG. 1 is a schematic cross section of a conventional silicon pressure sensor in a metal can package. As shown in FIG. 1, the pressure sensor package consists of a silicon die 10 having an etched diaphragm 12, a backing wafer 14 usually made of Pyrex, a metal can 16 (e.g., TO-8 or TO-5) which houses the pressure sensor, metal pins 18 for providing external interconnection, and a pressure port 20. The metal can 16 is welded at 22 to maintain a vacuum reference in region 24, or in the case of differential or gage pressure measurements, a top-side pressure port 26 is provided.

FIG. 2 is a schematic cross section of a conventional pressure sensor in a plastic package 28. The plastic package pressure sensor 28 consists of a silicon die 30 having a diaphragm 32, and a backing wafer 34 typically consisting of Pyrex, which is anodically bonded to the silicon die 30, to form a vacuum cavity 36 therebetween for providing absolute pressure measurements. The backing wafer 34 is attached to a bottom portion 46 of the plastic package 28 using an epoxy or RTV die attach. A gel overcoat 38 (e.g., silicon gel) is provided over the silicon die 30 for communicating pressure from external gaseous media. The plastic package 28 further includes a lid 40 having an opening 42 for directing external pressure to the sensor. The silicon gel provides a minimal amount of protection from adverse effects of the gaseous media for the sensor, circuits and wire interconnects.

SUMMARY OF THE INVENTION

In one embodiment, the present invention comprises a chip-scale sensor package. The chip-scale sensor package includes a semiconductor substrate having a sensor region, and a semiconductor cap having a recess. The semiconductor cap is bonded to the semiconductor substrate with a thermocompression bond to form a cavity therebetween. The semiconductor substrate and/or the semiconductor cap may optionally include one or more semiconductor devices such as an electronically trimmable integrated circuit fabricated thereon using conventional integrated circuit fabrication techniques. In addition, the semiconductor substrate may optionally include an integral stress isolation flexible region for isolation of the sensor region.

BRIEF DESCRIPTION OF THE DRAWINGS

FIG. 4 is a schematic cross section of the pressure sensor of FIG. 3a further including electronic circuitry located within the bond ring.

FIG. 5 is a schematic cross section of a gage or differential chip-scale packaged pressure sensor according to another embodiment of the present invention.

FIG. 6 is a schematic cross section of the chip-scale packaged pressure sensor of FIG. 3a having an optionally deposited protective coating.

FIG. 7b is a schematic cross section of the ball grid array pressure sensor package of FIG. 7a.

FIGS. 8a–8l illustrate several exemplary wafer-to-wafer bonding techniques using thermocompression bonding.

FIG. 9 illustrates an exemplary glass film wafer-to-wafer bonding configuration according to another embodiment of the present invention.

DETAILED DESCRIPTION

The present invention comprises a chip-scale packaged pressure sensor capable of measuring absolute, differential, or gage pressure with optional on-chip integration, electronic trimming, stress isolation, through-wafer vias for external connections, and specialized coatings for media isolation. The sensor capsule may be used as a stand-alone unit or inside a secondary housing.

In one embodiment, the chip-scale packaged pressure sensor comprises a semiconductor substrate having a sensor region, and a semiconductor cap having a recess. The semiconductor cap is bonded to the semiconductor substrate using a thermocompression bond to form a cavity therebetween, as will be described in more detail below. The semiconductor substrate and/or the semiconductor cap may optionally include one or more semiconductor devices such as an electronically trimmable integrated circuit fabricated thereon using conventional integrated circuit fabrication techniques. In addition, the semiconductor substrate may optionally include an integral stress isolation flexible region for isolating the sensor region from mounting and packaging stresses.

Figure 1:
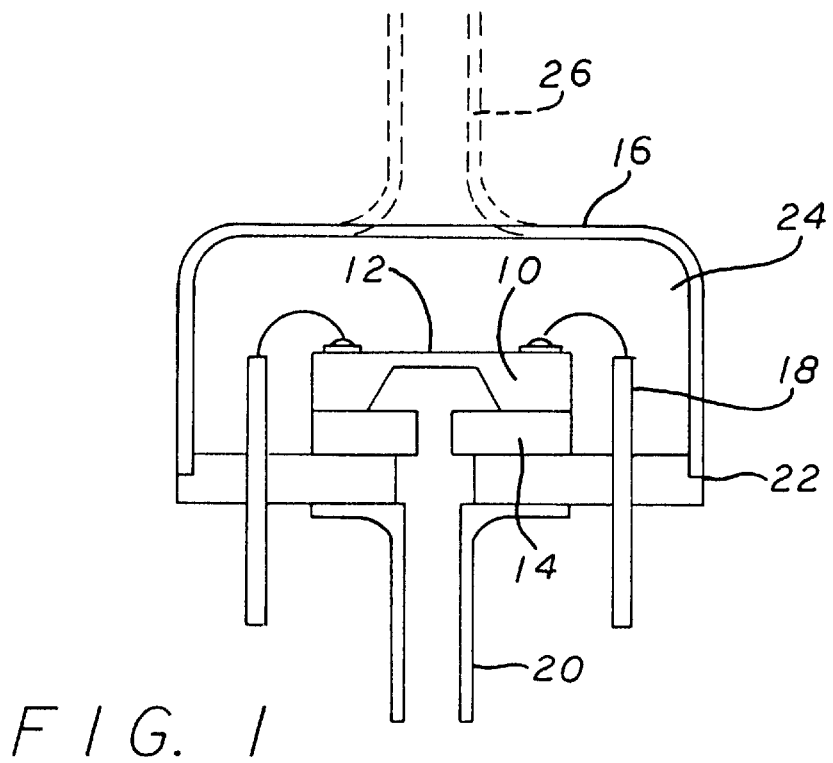
FIG. 1 is a schematic cross section of a prior art silicon pressure sensor in a metal can package.
Figure 2:
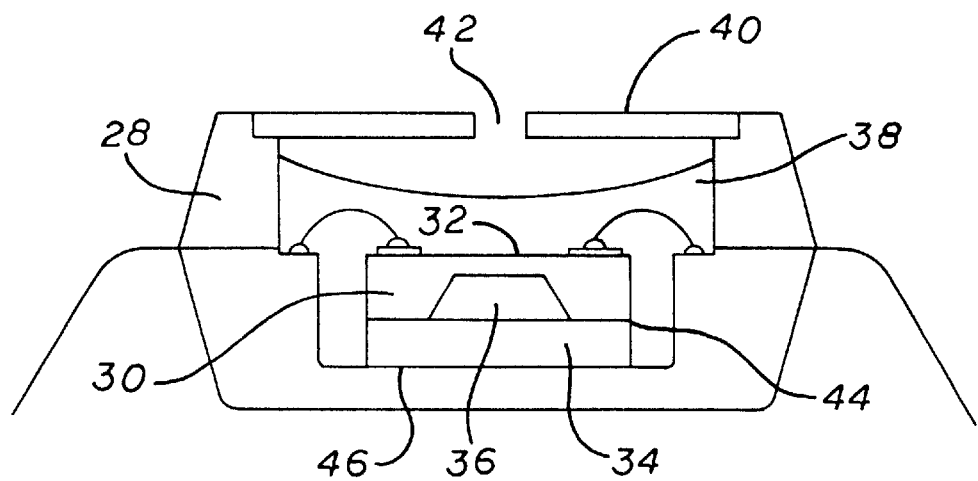
FIG. 2 is a schematic cross section of a prior art pressure sensor in a plastic package.
Figure 3A:
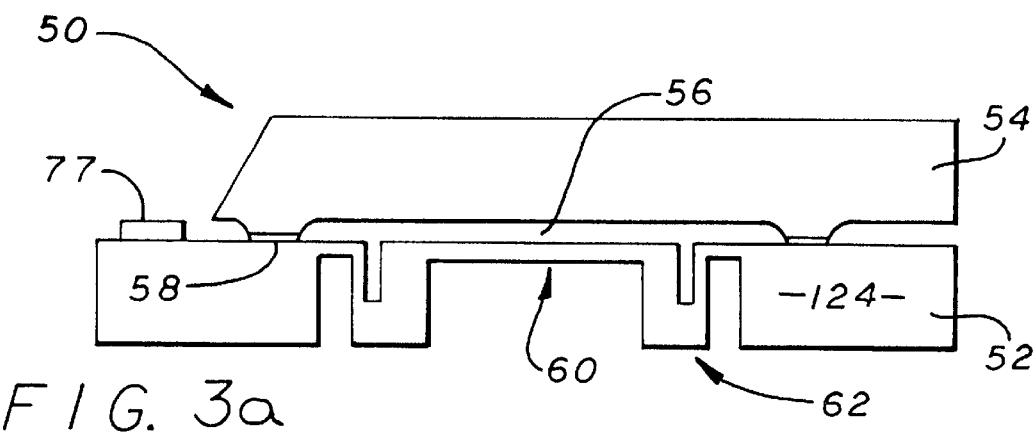
FIG. 3a is a schematic cross section of a chip-scale packaged pressure sensor according to one embodiment of the present invention.

FIG. 3a is a schematic cross section of a chip-scale packaged pressure sensor 50 according to a first embodiment of the present invention. As shown in FIG. 3a, the pressure sensor 50 comprises a silicon cap wafer 54 having a recess 56, and a sensor die 52 that includes a silicon diaphragm 60 and an integral stress isolation flexible region 62. The integral stress isolation flexible region 62 protects and isolates the diaphragm 60 from thermal and mounting stresses in the peripheral (or frame) region 124 of the die 52. The flexible diaphragm 60 includes piezoresistive elements (not shown) for sensing stress in the diaphragm 60. A bond ring 58 is used to hermetically attach the cap wafer 54 to the sensor die 52 under vacuum and form a vacuum cavity therebetween for providing an absolute pressure reference. The bond ring 58 comprises a ring of thermocompression bond material as will be described with respect to FIGS. 8a–8l.

Figure 3C:
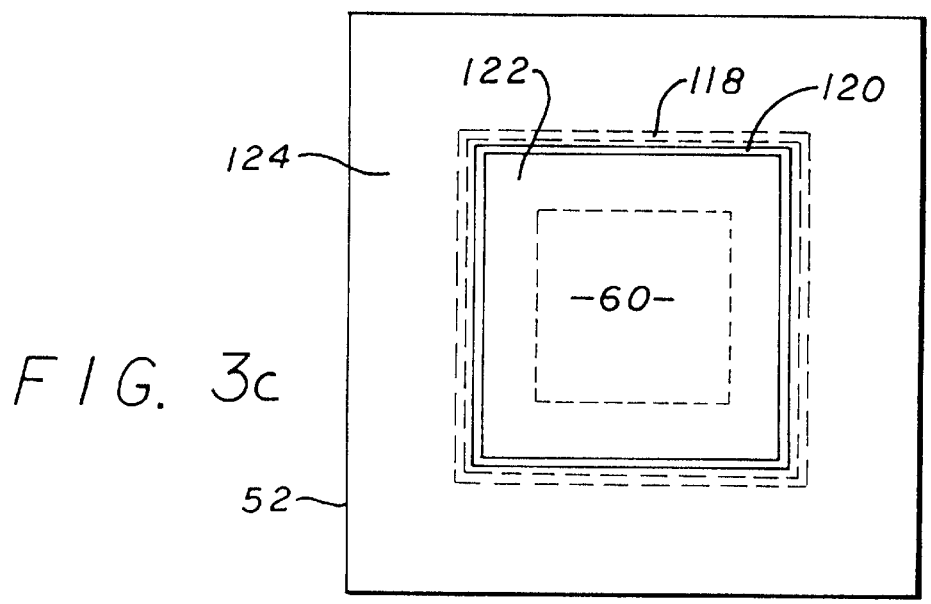
FIG. 3c is a top view of the stress-isolated sensor die of FIG. 3a according to one embodiment of the present invention.
Figure 3D:
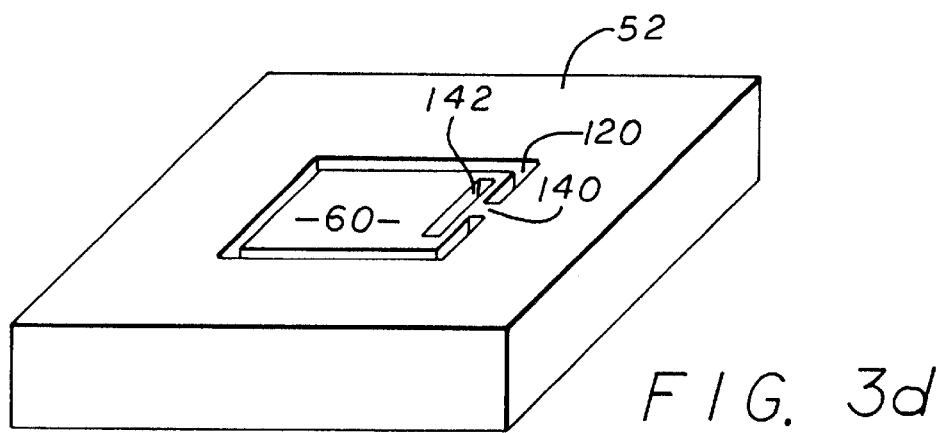
FIG. 3d is a perspective view of the stress-isolated region on a semiconductor die according to another embodiment of the present invention.
Figure 3B:
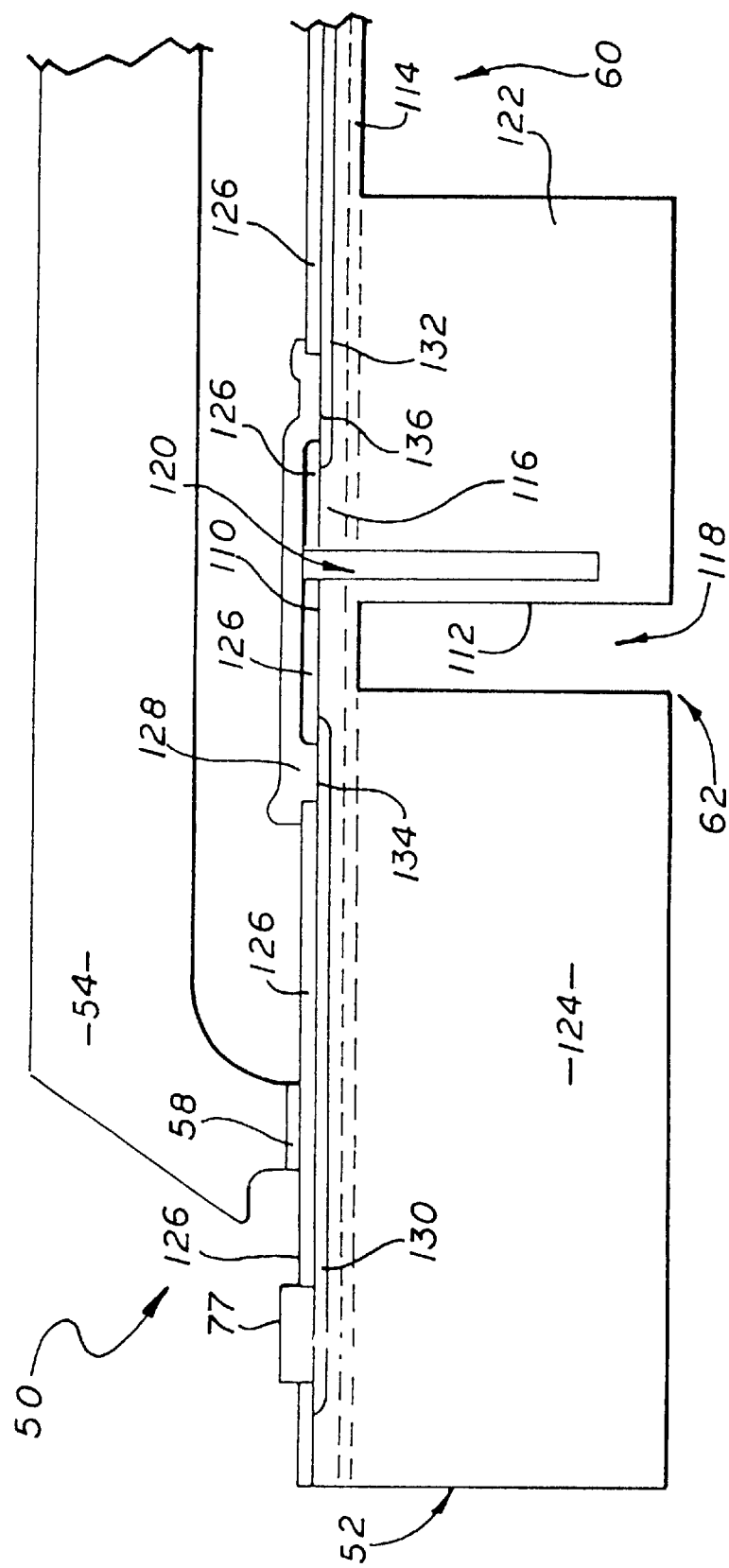
FIG. 3b is a view of a portion of the pressure sensor of FIG. 3a, taken on an expanded scale.

FIG. 3b is a view of a portion of the pressure sensor 50 of FIG. 3a, taken on an expanded scale. As shown in FIG.

3b, the stress isolation flexible region 62 includes a horizontal member 110 integral with the frame region 124, and a vertical member 112 having a first end integral with a second end of the horizontal member 110, and a second end integral with a rim region 122. Prior to formation of the horizontal and vertical members 110 and 112, and the diaphragm 60, an oxide layer 114 is formed in the silicon substrate sensor die 52. The oxide layer 114 is formed in the silicon substrate sensor die 52 using, but not limited or restricted to, a Silicon Implanted with Oxygen ("SIMOX") or Bonded and Etched Silicon-on-Insulator ("BESOI") technique commonly known in the art. The oxide layer 114 provides a suitable etch stop for a bottom side etch. A silicon epitaxial layer 116 (e.g., N-) is then deposited, as needed, above the oxide layer 114 to increase the thickness of the diaphragm 60. Moderately doped P-type layers 130 and 132 are formed in the epitaxial layer 116.

A second oxide layer 126 is disposed over the epitaxial layer 116 extending across the width of the sensor die 52. After depositing the second oxide layer 126, the upper trench 120 is formed, as will be described in more detail below. The second oxide layer 126 is etched in at least three places including an etch on the outside of the bond ring 58 for placing a metal contact or pad 77, and at both sides of the stress isolation region 62, as shown by numerals 134 and 136. A pad 77 is placed over the etch outside of the bond ring 58, and a metal interconnect layer 128 is placed between etches 134 and 136. The doped P-type layer 130 connects the metal contact 128 at numeral 134, under the bond ring 58, to the pad 77. The doped P-type layer 132 connects the metal contact 128 at numeral 136 to circuitry in the diaphragm region 60 such as a piezoresistive element (not shown). This provides interconnection between the piezoresistive elements disposed on the diaphragm 60 (and other circuitry inside the bonding ring 58) and one or more pads 77 outside of the bonding ring 58. The second oxide layer 126 also isolates the P-type layer 130 from the thermocompression bond ring 58.

The horizontal and vertical members 110 and 112 are formed by vertically etching lower and upper trenches 118 and 120 from the bottom and top of the sensor die 52, respectively. A series of silicon and oxide etch steps are utilized to complete the upper trench 120. Formation of the horizontal and vertical members 110 and 112 is achieved using an etching process such as, but not limited or restricted to, deep reactive ion etching ("D-RIE") of silicon, a known etching technique which allows deep trenches to be etched in silicon with high aspect ratios and nearly vertical walls on each side of the wafer. The pressure-sensitive diaphragm 60 can also be etched using the D-RIE technique, and may be done at the same time as the backside etch used to form the horizontal member 110.

Accuracy in the thickness of the horizontal member 110 and deformable diaphragm 60 is enhanced by the inclusion of the oxide layer 114 at a depth from the top surface equal to the desired thickness of the diaphragm, since the etch rate of such oxide is much slower than that of bulk silicon. Though silicon-on-insulator ("SOI") material is used in cases where a thin, highly uniform diaphragm 60 is desired, standard material (non-SOI) may be used in conjunction with a timed etch to provide thicker diaphragm layers. Electric discharge machining or other micromachining techniques may also be used to form the flexible horizontal and vertical members 110 and 112, if desired.

In one embodiment, the horizontal and vertical members 110 and 112 each have an aspect ratio (length to thickness) of approximately 10 to 1. That is, the length of each member is approximately ten times the thickness of the respective member, thereby providing good flexibility to confine externally generated stresses to the frame region 124 only. Other aspect ratios, as low as 1:1 or greater than 10:1, may be used depending on a number of factors including, but not limited to, the amount of stress that the frame region 124 may be subjected to, the thickness of the diaphragm 60, etc. The stress isolation flexible region 62 so formed is integral with the outer frame region 124. The horizontal and vertical members 110 and 112 support a nominally rigid rim region 122 with the same providing an isolated, rigid support for the pressure-sensitive diaphragm 60.

FIG. 3c is a top view of the stress-isolated sensor die of FIG. 3a according to one embodiment of the present invention. In the embodiment shown, the diaphragm 60 is shaped as a square. However, the diaphragm may be formed of any shape such as, for example, a circular diaphragm. Four piezoresistive elements (not shown) are disposed on the surface of the diaphragm 60 and are connected in a Wheatstone bridge configuration for sensing bending stresses and providing an output signal in response thereto. The lower trench 118 defines the horizontal member 110 (see FIG. 3b) whereas the upper trench 120 fabricated in close proximity to the lower trench 118 forms the vertical member 112 (see FIG. 3b). Cross-over regions for electrical interconnections are not shown.

FIG. 3d is a perspective view of the stress-isolated region 60 on a semiconductor die according to another embodiment of the present invention. A bridge region 140 is provided over the upper trench 120 for routing metal traces to and from the stress-isolated region 60 (e.g., the traces that are connected to the piezoresistive elements). Supplemental isolation may optionally be provided by using a rectangular upper trench 142 near the bridge region 140.

FIG. 4 illustrates the pressure sensor 50 of FIG. 3a further including electronic circuitry located within the bond ring 58. Active electronic circuitry may be located and fabricated inside the bond ring 58 of the sensor die 52, as shown by numerals 64 and 65. In addition, active electronic circuitry may be located on either the top-side (not shown) or bottom-side, as shown by numeral 66, of the cap wafer 54. Fabricating the electronic circuitry within the bond ring 58 environmentally protects the same from gaseous and/or fluid media. The cap wafer 54 may contain etched holes for wire bond access to the sensor die 52 (see, e.g., FIG. 7b).

Active electronic circuitry may be optionally fabricated directly on the sensor die 52 for amplification, signal correction, etc., before the cap wafer 54 and the sensor die 52 are joined. An exemplary active electronic circuitry includes electronically trimmable circuitry which eliminates the need for laser trimming. While the embodiments illustrated in the drawings have the circuitry outboard of the flexible stress isolation region 62, some or all of the circuitry, such as zero offset compensation, scale factor correction, and amplification circuitry may be located in the thick rim region 122, as shown by numeral 65, to also isolate such circuitry from stress imposed from or through the package. Alternatively, circuitry may be fabricated on the diaphragm 60.

FIG. 5 is a schematic cross section of a gage or differential chip-scale packaged pressure sensor according to another embodiment of the present invention. In this embodiment, a second pressure port 68 is etched in the cap wafer 54 to provide top-side access for gage or differential sensing. Alternatively, the pressure port may be formed by slots in the vicinity of the bond ring region 58. Additional protection against corrosive media can be attained by the use of protective coatings such as silicon nitride, silicon carbide, amorphous diamond or polymeric films deposited on a bottom-side 70 of the sensor die 52, as shown in FIG. 6. Front-side protective coatings may be provided in addition to or in lieu of the bottom-side protective coating. Additionally, a coating may also be deposited from the top of the sensor die 52 to protect the diaphragm, wire traces, and co-fabricated integrated circuitry, particularly in the case of gage or differential sensors.

Figure 7A:
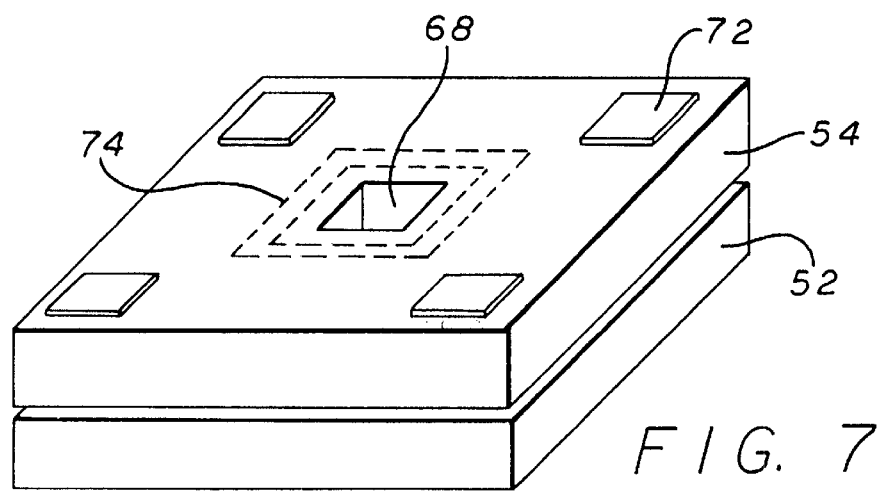
FIG. 7a is a perspective view of a ball grid array pressure sensor package according to one embodiment of the present invention.
Figure 7B:
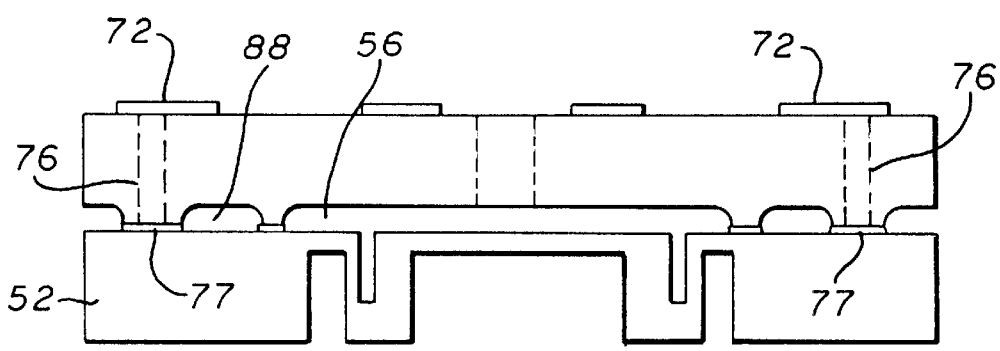

FIG. 7*a* is a perspective view of a ball grid array ("BGA") pressure sensor package according to one embodiment of the present invention. Referring to FIG. 7*a*, a set of pads 72 is provided to form a micro BGA on the cap wafer 54. This view shows the optional top-side pressure port 68 (as shown in FIG. 5) on top of the cap wafer 54. The top-side pressure port 68 includes a seal ring 74 there-around for attaching a pressure port to provide environmental protection of bonding pads. The pads 72 are electrically connected to circuitry on the sensor die 52 by a series of through-the-wafer holes. FIG. 7*b* is a schematic cross section of the BGA pressure sensor package of FIG. 7*a*. This view shows a series of vias 76 that provide the interconnection between pads 77 on the sensor die 52 and pads 72 on the cap wafer 54. An optional second cavity 88 may be formed between the sensor die 52 and cap wafer 54.

Figure 7C:
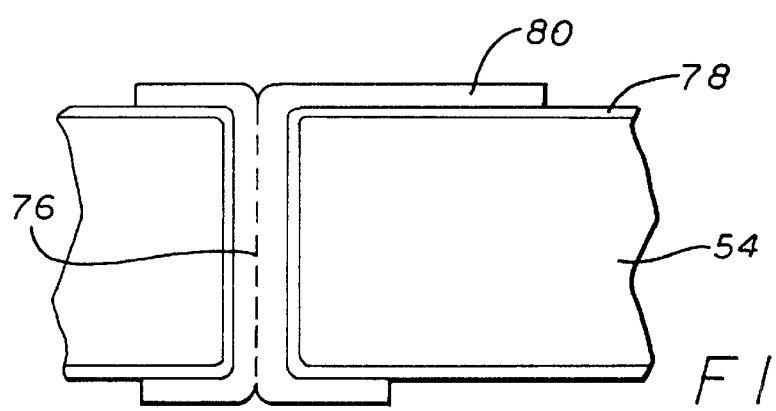
FIG. 7c is a schematic cross section of a through-wafer via, taken on an expanded scale.

FIG. 7*c* illustrates a view of a through-wafer via, taken on an expanded scale. D-RIE is used to form holes completely through the cap wafer 54, which is then oxidized to form an oxide layer 78, and then through-plated with metal 80 (e.g., MOCVD aluminum). Subsequent patterning provides the electrical interconnections between the front and back of the cap wafer 54.

The present invention utilizes various materials to incorporate thermocompression bonds to form semiconductor sensors. These materials provide wafer-to-wafer hermetic bonds, have reasonable step coverage over underlying topology, and are compatible with existing integrated circuit ("IC") processing. Aluminum and gold metallurgical systems have widespread use in integrated circuit metal interconnects and pad builds. These materials have thermocompression bonds with other IC-compatible materials, such as germanium and polysilicon or single crystal silicon, respectively. By way of illustration, a bond ring comprising aluminum, gold, or polysilicon may be formed on the sensor die 52, while the silicon cap wafer 54 may be coated with germanium, uncoated, or gold coated, respectively. The two wafers (sensor die 52 and silicon cap 54) are placed in physical contact under elevated temperature and pressure to form the bond.

The silicon cap wafer 54 has a cavity inside the bond ring region, to allow for deflections of the deformable diaphragm 60 and to form a vacuum chamber for absolute sensor capsules or a controlled environment for other semiconductor devices. The cap wafer 54 may also have one or more recesses (see, e.g., cavity 88 in FIG. 7*b*) for clearance between the cap wafer and underlying devices. The recesses and cavities may be formed by etching the cap wafer, or they may be formed by a thick ring of thermocompression bond material, such as that obtained by a plating operation. The thermocompression wafer bond temperature is selected to be higher than any post-bond sequence, such as hard die attach, and lower than the temperature at which degradation of the active devices occurs. The thermocompression temperature range is preferably between 180° C. to 500° C.

Figure 8A:
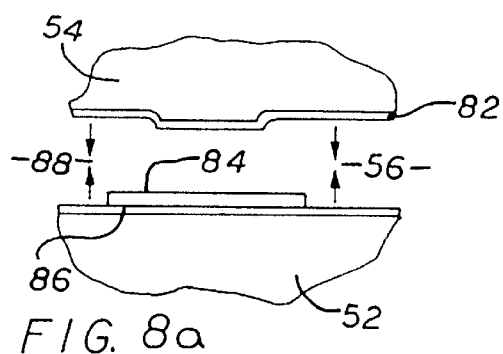

FIGS. 8*a*–8*l* illustrate several exemplary wafer-to-wafer bonding approaches using thermocompression bonding (such as, but not limited or restricted to, eutectic bonding). As shown in FIG. 8*a*, a thin film of germanium 82 is deposited onto the silicon cap wafer 54 and a corresponding aluminum ring 84 is deposited on the sensor die wafer 84 (shown on the field oxide 86). After surface cleaning, the wafers are aligned in a special fixture and inserted into a wafer-to-wafer bonder. Bonding is performed at elevated temperatures while pressing the wafers together. In one embodiment, an aluminum-germanium thermocompression bond is used with a eutectic temperature of 424° C. A vacuum ambient may be incorporated into the cavities by pumping down the bonding chamber prior to elevating the temperature. When the wafers are bonded, predefined recesses and cavities are formed in regions, as shown by numerals 56 and 88 in FIG. 7*b*.

Figure 8E:
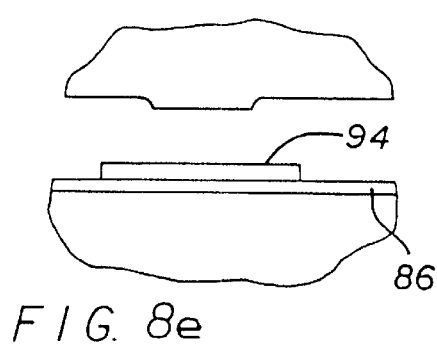
Figure 8B:
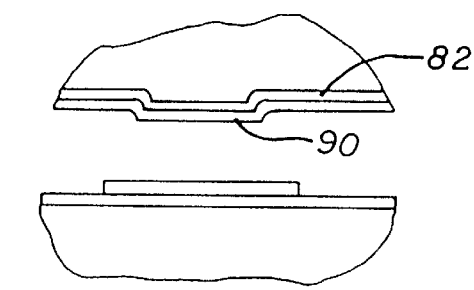

FIG. 8*b* shows a deposited aluminum film 90 on top of the germanium 82 which provides a protective layer against oxidation of the germanium 82 and allows the same cleaning cycles to be performed on the cap and sensor wafers 52 and 54, respectively. A thermal oxide 92 may optionally be incorporated underneath the germanium 82, as shown in FIG. 8*c*, and may optionally be incorporated underneath the germanium 82 and the aluminum film 90, as shown in FIG. 8*d*.

Figure 8F:
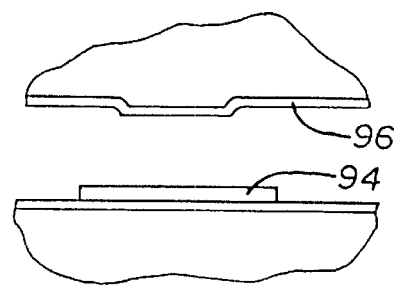
Figure 8C:
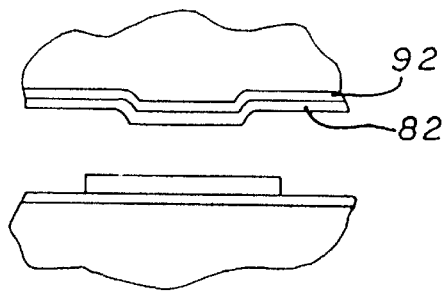
Figure 8G:
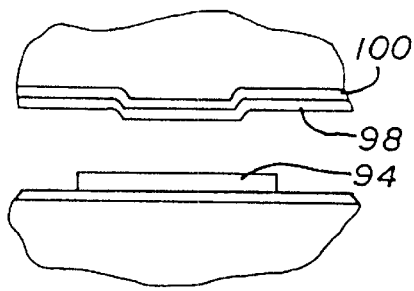
Figure 8D:
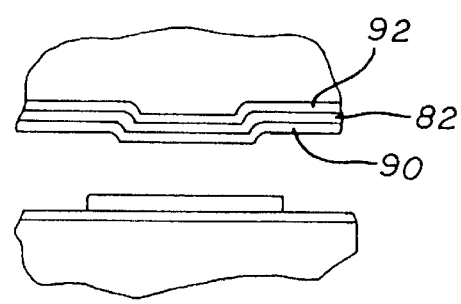
Figure 8H:
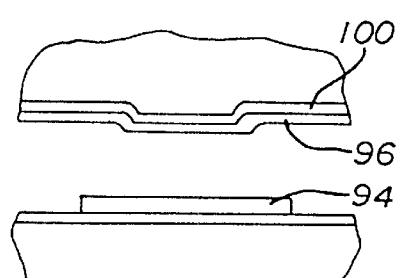

FIGS. 8*e*–8*h* illustrate a gold-silicon thermocompression bond. FIG. 8*e* shows a gold bond ring 94 located on a field oxide 86 of the sensor die wafer 52. FIG. 8*f* shows that the gold bond ring 94 of the sensor die wafer 52 may be bonded to a thin film of gold 96 deposited onto the silicon cap wafer 54. In one embodiment, the gold-silicon eutectic temperature is at 363° C. In an alternative embodiment, as shown in FIG. 8*g*, the gold bond ring 94 deposited on the sensor die wafer 52 is bonded to a layer of polysilicon 98, which is deposited on a layer of thermal oxide 100, of the cap wafer 54. FIG. 8*h* shows a layer of thermal oxide 100 optionally incorporated underneath the gold layer 96 on the silicon cap wafer 54.

In yet another embodiment, a polysilicon bond ring 102 is provided on the sensor die wafer 52 with a field oxide 86 incorporated therebetween, as shown in FIG. 8*i*. In this embodiment, a layer of gold 96 is deposited on the silicon cap wafer 52 to complete the thermocompression wafer-to-wafer bonding materials. A variation of FIG. 8*i* includes depositing a layer of gold 94 on top of the polysilicon 102, as shown in FIG. 8*j*. A further variation of FIG. 8*i* includes incorporating a layer of thermal oxide 92 underneath the gold layer 96 of the silicon cap wafer 54, as shown in FIG. 8*k*. FIG. 8*l* shows the combination of the thermocompression bonding material of the sensor die wafer 52 of FIG. 8*j* and thermocompression bonding material of the silicon cap wafer 54 of FIG. 8*k*. Additional adhesion layers and barrier layers may also be included.

FIG. 9 illustrates an exemplary glass film wafer-to-wafer bonding configuration according to another embodiment of the present invention. In this embodiment, a low temperature glass film 104, such as a borophosphosilicate glass, which provides a good seal over underlying metal traces and active devices, is used.

The present invention solves numerous packaging problems by providing an integral vacuum reference, integral stress isolation flexible region, and compatibility with co-fabricated integrated electronic circuits for a single-chip solution without the requirement for laser trimming. The present invention further includes an optional coating to eliminate costly barrier diaphragms and optional through-wafer vias for top-side and/or bottom-side interconnection as a surface mounted or ball grid array component. The chip-scale packaged pressure sensor of the present invention may be used in conjunction with signal compensation, conversion, communication electronics, and the like.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A chip-scale sensor package, comprising:
   a semiconductor substrate including at least one electronically trimmable integrated circuit fabricated thereon and a sensor region; and
   a semiconductor cap including a recess, wherein the semiconductor cap is bonded to the semiconductor substrate with a thermocompression bond to form a cavity therebetween.

2. The chip-scale sensor package of claim 1, wherein the sensor region comprises a deformable diaphragm for sensing external pressure.

3. The chip-scale sensor package of claim 2, wherein the cavity forms a hermetically sealed integral pressure vacuum reference.

4. The chip-scale sensor package of claim 2, wherein the cavity forms a hermetically sealed integral pressure vacuum reference.

5. The chip-scale sensor package of claim 1, wherein the semiconductor cap is bonded to the semiconductor substrate at a temperature ranging between 180° C. and 500° C.

6. The chip-scale sensor package of claim 5, wherein the semiconductor cap is bonded to the semiconductor substrate using aluminum and germanium.

7. The chip-scale sensor package of claim 5, wherein the semiconductor cap is bonded to the semiconductor substrate using gold and polycrystalline silicon.

8. The chip-scale sensor package of claim 5, wherein the semiconductor cap is bonded to the semiconductor substrate using gold and single-crystal silicon.

9. The chip-scale sensor package of claim 5, wherein the semiconductor cap is bonded to the semiconductor substrate using a low-temperature glass bond.

10. The chip-scale sensor package of claim 5, wherein the semiconductor cap is bonded to the semiconductor substrate and forms a hermetically sealed reference pressure.

11. The chip-scale sensor package of claim 1 further comprising an integral stress isolation flexible region.

12. The chip-scale sensor package of claim 11 wherein the stress isolation flexible region includes:
    a first member including a first end coupled to a frame region of the semiconductor die, and a second end; and
    a second member including a first end coupled to the second end of the first member, and a second end coupled to a rim region of the semiconductor die.

13. The chip-scale sensor package of claim 12 wherein a first wall etch is used to define the first member and a second wall etch is used such that the combination of the first and second wall etches define the second member.

14. The chip-scale sensor package of claim 1, wherein the semiconductor cap includes holes for wire bonding.

15. The chip-scale sensor package of claim 1, wherein the semiconductor cap includes a pressure port for gage and differential pressure sensing.

16. The chip-scale sensor package of claim 1, wherein the semiconductor cap includes a plurality of holes which allow electrical interconnection through the semiconductor cap.

17. The chip-scale sensor package of claim 1, wherein the semiconductor substrate includes a plurality of holes which allow electrical interconnection through the semiconductor substrate.

18. The chip-scale sensor package of claim 1 further comprising a protective coating deposited on a bottom side of the semiconductor substrate and alternatively on a top side of the semiconductor cap to protect the environmentally exposed surfaces.

19. A chip-scale sensor package, comprising:
    a semiconductor substrate including a diaphragm, a stress isolation flexible region to isolate the diaphragm, and integrated circuits which are electronically trimmable; and
    a semiconductor cap including a recess, wherein the semiconductor cap is bonded to the semiconductor substrate with a thermocompression bond to form a cavity therebetween.

20. A chip-scale sensor method, comprising the acts of:
    providing a semiconductor substrate including a diaphragm;
    providing a semiconductor cap including a recess region;
    providing integrated circuits which are electronically trimmable on at least one of the semiconductor substrate and the semiconductor cap;
    bonding the semiconductor cap to the semiconductor substrate using a thermocompression bond to form a vacuum cavity therebetween.

21. A chip-scale sensor package, comprising:
    a semiconductor substrate including a diaphragm and a stress isolation flexible region to isolate the diaphragm; and
    a semiconductor cap including a recess and integrated circuits which are electronically trimmable, wherein the semiconductor cap is bonded to the semiconductor substrate with a thermocompression bond to form a cavity therebetween.

22. The chip-scale packaged sensor of claim 21 further comprising a protective coating deposited on the semiconductor substrate and alternatively the semiconductor cap for protecting the environmentally exposed surfaces.

23. A chip-scale sensor package, comprising:
    a semiconductor substrate including a sensor region; and
    a semiconductor cap including a recess and at least one electronically trimmable integrated circuit, wherein the semiconductor cap is bonded to the semiconductor substrate with a thermocompression bond to form a cavity therebetween.

24. The chip-scale sensor package of claim 23, wherein the sensor region comprises a deformable diaphragm for sensing external pressure.

25. The chip-scale sensor package of claim 24, wherein the cavity forms a hermetically sealed integral pressure vacuum reference.

26. The chip-scale sensor package of claim 23, wherein the semiconductor cap is bonded to the semiconductor substrate at a temperature ranging between 180° C. and 500° C.

27. The chip-scale sensor package of claim 26, wherein the semiconductor cap is bonded to the semiconductor substrate using aluminum and germanium.

28. The chip-scale sensor package of claim 26, wherein the semiconductor cap is bonded to the semiconductor substrate using gold and polycrystalline silicon.

29. The chip-scale sensor package of claim 26, wherein the semiconductor cap is bonded to the semiconductor substrate using gold and single-crystal silicon.

30. The chip-scale sensor package of claim 26, wherein the semiconductor cap is bonded to the semiconductor substrate using a low-temperature glass bond.

31. The chip-scale sensor package of claim 26, wherein the semiconductor cap is bonded to the semiconductor substrate and forms a hermetically sealed reference pressure.

32. The chip-scale sensor package of claim 23 further comprising an integral stress isolation flexible region.

33. The chip-scale sensor package of claim 32 wherein the stress isolation flexible region includes:
   a first member including a first end coupled to a frame region of the semiconductor die, and a second end; and
   a second member including a first end coupled to the second end of the first member, and a second end coupled to a rim region of the semiconductor die.

34. The chip-scale sensor package of claim 33 wherein a first wall etch is used to define the first member and a second wall etch is used such that the combination of the first and second wall etches define the second member.

35. The chip-scale sensor package of claim 23, wherein the semiconductor cap includes holes for wire bonding.

36. The chip-scale sensor package of claim 23, wherein the semiconductor cap includes a pressure port for gage and differential pressure sensing.

37. The chip-scale sensor package of claim 23, wherein the semiconductor cap includes a plurality of holes which allow electrical interconnection through the semiconductor cap.

38. The chip-scale sensor package of claim 23, wherein the semiconductor substrate includes a plurality of holes which allow electrical interconnection through the semiconductor substrate.

39. The chip-scale sensor package of claim 23 further comprising a protective coating deposited on a bottom side of the semiconductor substrate and alternatively on a top side of the semiconductor cap to protect the environmentally exposed surfaces.

40. A chip-scale sensor package, comprising:
   a semiconductor substrate including a sensor region; and
   a semiconductor cap including a recess, wherein the semiconductor cap is bonded to the semiconductor substrate using aluminum and germanium, at a temperature ranging between 180° C. and 500° C., with a thermocompression bond, to form a cavity therebetween.

41. The chip-scale sensor package of claim 40, wherein the sensor region comprises a deformable diaphragm for sensing external pressure.

42. The chip-scale sensor package of claim 41, wherein the cavity forms a hermetically sealed integral pressure vacuum reference.

43. The chip-scale sensor package of claim 40, wherein the cavity forms a hermetically sealed reference pressure.

44. The chip-scale sensor package of claim 40 further comprising an integral stress isolation flexible region.

45. The chip-scale sensor package of claim 44 wherein the stress isolation flexible region includes:
   a first member including a first end coupled to a frame region of the semiconductor die, and a second end; and
   a second member including a first end coupled to the second end of the first member, and a second end coupled to a rim region of the semiconductor die.

46. The chip-scale sensor package of claim 45 wherein a first wall etch is used to define the first member and a second wall etch is used such that the combination of the first and second wall etches define the second member.

47. The chip-scale sensor package of claim 40, wherein the semiconductor cap includes holes for wire bonding.

48. The chip-scale sensor package of claim 40, wherein the semiconductor cap includes a pressure port for gage and differential pressure sensing.

49. The chip-scale sensor package of claim 40, wherein the semiconductor cap includes a plurality of holes which allow electrical interconnection through the semiconductor cap.

50. The chip-scale sensor package of claim 40, wherein the semiconductor substrate includes a plurality of holes which allow electrical interconnection through the semiconductor substrate.

51. The chip-scale sensor package of claim 40 further comprising a protective coating deposited on a bottom side of the semiconductor substrate and alternatively on a top side of the semiconductor cap to protect the environmentally exposed surfaces.

52. A chip-scale sensor package, comprising:
   a semiconductor substrate including a sensor region;
   a semiconductor cap including a recess, wherein the semiconductor cap is bonded to the semiconductor substrate with a thermocompression bond to form a cavity therebetween; and
   an integral stress isolation flexible region.

53. The chip-scale sensor package of claim 52, wherein the sensor region comprises a deformable diaphragm for sensing external pressure.

54. The chip-scale sensor package of claim 53, wherein the cavity forms a hermetically sealed integral pressure vacuum reference.

55. The chip-scale sensor package of claim 52, wherein the semiconductor cap is bonded to the semiconductor substrate at a temperature ranging between 180° C. and 500° C.

56. The chip-scale sensor package of claim 55, wherein the semiconductor cap is bonded to the semiconductor substrate using aluminum and germanium.

57. The chip-scale sensor package of claim 55, wherein the semiconductor cap is bonded to the semiconductor substrate using gold and polycrystalline silicon.

58. The chip-scale sensor package of claim 55, wherein the semiconductor cap is bonded to the semiconductor substrate using gold and single-crystal silicon.

59. The chip-scale sensor package of claim 55, wherein the semiconductor cap is bonded to the semiconductor substrate using a low-temperature glass bond.

60. The chip-scale sensor package of claim 55, wherein the semiconductor cap is bonded to the semiconductor substrate and forms a hermetically sealed reference pressure.

61. The chip-scale sensor package of claim 52 wherein the stress isolation flexible region includes:
   a first member including a first end coupled to a frame region of the semiconductor die, and a second end; and
   a second member including a first end coupled to the second end of the first member, and a second end coupled to a rim region of the semiconductor die.

62. The chip-scale sensor package of claim 61 wherein a first wall etch is used to define the first member and a second wall etch is used such that the combination of the first and second wall etches define the second member.

63. The chip-scale sensor package of claim 52, wherein the semiconductor cap includes holes for wire bonding.

64. The chip-scale sensor package of claim 52, wherein the semiconductor cap includes a pressure port for gage and differential pressure sensing.

65. The chip-scale sensor package of claim 52, wherein the semiconductor cap includes a plurality of holes which allow electrical interconnection through the semiconductor cap.

66. The chip-scale sensor package of claim 52, wherein the semiconductor substrate includes a plurality of holes which allow electrical interconnection through the semiconductor substrate.

67. The chip-scale sensor package of claim 52 further comprising a protective coating deposited on a bottom side of the semiconductor substrate and alternatively on a top side of the semiconductor cap to protect the environmentally exposed surfaces.

68. A chip-scale sensor package, comprising:
a semiconductor substrate including a sensor region and a plurality of holes which allow electrical interconnection through the semiconductor substrate; and
a semiconductor cap including a recess, wherein the semiconductor cap is bonded to the semiconductor substrate with a thermocompression bond to form a cavity therebetween.

69. The chip-scale sensor package of claim 68, wherein the sensor region comprises a deformable diaphragm for sensing external pressure.

70. The chip-scale sensor package of claim 68, wherein the semiconductor cap is bonded to the semiconductor substrate at a temperature ranging between 180° C. and 500° C.

71. The chip-scale sensor package of claim 70, wherein the semiconductor cap is bonded to the semiconductor substrate using aluminum and germanium.

72. The chip-scale sensor package of claim 70, wherein the semiconductor cap is bonded to the semiconductor substrate using gold and polycrystalline silicon.

73. The chip-scale sensor package of claim 70, wherein the semiconductor cap is bonded to the semiconductor substrate using gold and single-crystal silicon.

74. The chip-scale sensor package of claim 70, wherein the semiconductor cap is bonded to the semiconductor substrate using a low-temperature glass bond.

75. The chip-scale sensor package of claim 70, wherein the semiconductor cap is bonded to the semiconductor substrate and forms a hermetically sealed reference pressure.

76. The chip-scale sensor package of claim 68 further comprising an integral stress isolation flexible region.

77. The chip-scale sensor package of claim 76 wherein the stress isolation flexible region includes:
a first member including a first end coupled to a frame region of the semiconductor die, and a second end; and
a second member including a first end coupled to the second end of the first member, and a second end coupled to a rim region of the semiconductor die.

78. The chip-scale sensor package of claim 77 wherein a first wall etch is used to define the first member and a second wall etch is used such that the combination of the first and second wall etches define the second member.

79. The chip-scale sensor package of claim 68, wherein the semiconductor cap includes holes for wire bonding.

80. The chip-scale sensor package of claim 68, wherein the semiconductor cap includes a pressure port for gage and differential pressure sensing.

81. The chip-scale sensor package of claim 68 further comprising a protective coating deposited on a bottom side of the semiconductor substrate and alternatively on a top side of the semiconductor cap to protect the environmentally exposed surfaces.

82. The chip-scale packaged sensor of claim 19 further comprising a protective coating deposited on the semiconductor substrate and alternatively the semiconductor cap for protecting the environmentally exposed surfaces.

* * * * *